US012641943B2

(12) United States Patent (10) Patent No.: US 12,641,943 B2
Ozeki et al. (45) Date of Patent: May 26, 2026

(54) DETECTION APPARATUS

(71) Applicant: Magnolia White Corporation, Tokyo (JP)

(72) Inventors: Yoshitaka Ozeki, Tokyo (JP); Takahiro Takeuchi, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 482 days.

(21) Appl. No.: 18/235,046

(22) Filed: Aug. 17, 2023

(65) Prior Publication Data

US 2023/0397449 A1 Dec. 7, 2023

Related U.S. Application Data

(63) Continuation of application No. PCT/JP2022/002147, filed on Jan. 21, 2022.

(30) Foreign Application Priority Data

Feb. 22, 2021 (JP) ................................. 2021-026604

(51) Int. Cl.
*H10K 39/32* (2026.01)
*G06V 40/13* (2022.01)

(52) U.S. Cl.
CPC ......... *H10K 39/32* (2023.02); *G06V 40/1318* (2022.01)

(58) Field of Classification Search
CPC .... H10K 39/32; G06V 40/1318; H10F 30/20; H10F 39/12; G09F 9/30
See application file for complete search history.

(56) References Cited

U.S. PATENT DOCUMENTS

2009/0068773 A1* 3/2009 Lai ........................ H10D 86/423
257/E21.04
2011/0001051 A1* 1/2011 Tanaka .................. H10F 39/026
250/366

(Continued)

FOREIGN PATENT DOCUMENTS

JP 2011-014752 A 1/2011
JP 2013-012696 A 1/2013
JP 2019-169670 A 10/2019

OTHER PUBLICATIONS

International Search Report issued in International Patent Application No. PCT/JP2022/002147 on Apr. 12, 2022 and English translation of same. 5 pages.

(Continued)

*Primary Examiner* — S M Sohel Imtiaz
(74) *Attorney, Agent, or Firm* — K&L Gates LLP

(57) ABSTRACT

A detection apparatus includes: a substrate; photodiodes each including a p-type semiconductor layer, an i-type semiconductor layer, and an n-type semiconductor layer; transistors provided for the respective photodiodes; an insulating film provided so as to cover the transistors; a first inorganic insulating film provided so as to cover the photodiodes; a first organic insulating film provided on the upper side of the first inorganic insulating film; and an upper conductive layer provided on the upper side of the first organic insulating film and electrically coupled to the photodiode. Each photodiode includes: first regions in each of which the p-type semiconductor layer, the i-type semiconductor layer, and the n-type semiconductor layer are directly in contact with one another; and a second region in which the p-type semiconductor layer and the i-type semiconductor layer are separate from each other. The adjacent first regions are coupled together by the p-type semiconductor layer.

20 Claims, 9 Drawing Sheets

(56) References Cited

U.S. PATENT DOCUMENTS

| | | | | |
|---|---|---|---|---|
| 2012/0299070 A1* | 11/2012 | Yamada | | H10F 77/334 |
| | | | | 257/E31.127 |
| 2016/0155782 A1* | 6/2016 | Sato | | H10F 10/17 |
| | | | | 257/82 |
| 2019/0171318 A1* | 6/2019 | Ryu | | H10K 50/844 |
| 2019/0296065 A1* | 9/2019 | Misaki | | H10F 39/016 |
| 2020/0203392 A1* | 6/2020 | Kang | | H10H 20/8506 |
| 2021/0042493 A1* | 2/2021 | Lius | | G09G 3/2003 |
| 2022/0223826 A1* | 7/2022 | Cho | | G02F 1/136286 |

OTHER PUBLICATIONS

Written Opinion issued in International Patent Application No. PCT/JP2022/002147 on Apr. 12, 2022. 4 pages.

* cited by examiner

FIG.4

DETECTION APPARATUS

CROSS-REFERENCE TO RELATED APPLICATION

This application is a continuation of International Patent Application No. PCT/JP2022/002147 filed on Jan. 21, 2022, which application claims the benefit of priority from Japanese Patent Application No. 2021-026604 filed on Feb. 22, 2021, the entire contents of which are incorporated herein by reference.

BACKGROUND

1. Technical Field

What is disclosed herein relates to a detection apparatus.

2. Description of the Related Art

Japanese Patent Application Laid-open Publication No. 2013-012696 (JP-A-2013-012696) describes a detection apparatus (photoelectric conversion device in JP-A-2013-012696) including a plurality of photoelectric conversion elements such as positive-intrinsic-negative (PIN) photodiodes arranged on a substrate. Such optical detection apparatuses are used as biometric sensors, such as fingerprint sensors and vein sensors, which detect biometric information. A plurality of photodiodes are arranged so as to be separated from one another at an arrangement pitch corresponding to the resolution of detection, and covered with an inorganic insulating film of, for example, silicon oxide or silicon nitride.

When the photodiodes are thickly formed, the covering property of the inorganic insulating film may be lowered. As a result, the reliability of the detection apparatus may be lowered. Since the inorganic insulating film is formed to be thinner than an organic insulating film, the parasitic capacitance generated between an upper electrode provided on the upper side of the inorganic insulating film and, for example, various types of wiring and semiconductor layers on the substrate side may increase, whereby the detection sensitivity is lowered.

SUMMARY

According to an aspect, a detection apparatus includes: a substrate; a plurality of photodiodes that are arranged on the substrate and each includes a p-type semiconductor layer, an i-type semiconductor layer, and an n-type semiconductor layer stacked on the substrate; a plurality of transistors provided for the respective photodiodes; an insulating film provided on the upper side of the substrate so as to cover the transistors; a first inorganic insulating film provided on the upper side of the insulating film so as to cover the photodiodes; a first organic insulating film provided on the upper side of the first inorganic insulating film; and an upper conductive layer that is provided on the upper side of the first organic insulating film and is electrically coupled to the photodiode through a contact hole passing through the first inorganic insulating film and the first organic insulating film in a thickness direction of the first inorganic insulating film and the first organic insulating film. Each of the photodiodes includes: a plurality of first regions in each of which the p-type semiconductor layer, the i-type semiconductor layer, and the n-type semiconductor layer are stacked so as to be directly in contact with one another; and a second region in which at least the p-type semiconductor layer and the i-type semiconductor layer are stacked so as to be separate from each other. The adjacent first regions are coupled together at least by the p-type semiconductor layer.

BRIEF DESCRIPTION OF THE DRAWINGS

FIG. 4 is a circuit diagram illustrating a detection element;

DETAILED DESCRIPTION

Figure 1A:
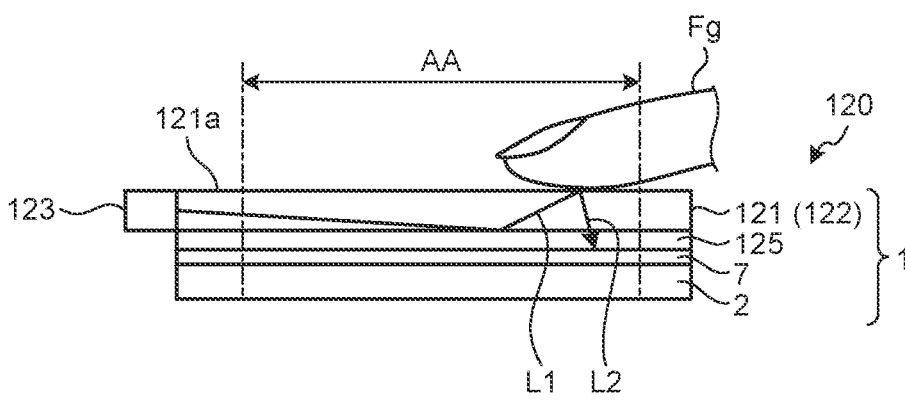
FIG. 1A is a sectional view illustrating a schematic sectional configuration of detection equipment having an illumination device, the detection equipment including a detection apparatus according to an embodiment.

The following describes a mode (embodiment) for carrying out the present disclosure in detail with reference to the drawings. The present disclosure is not limited to the description of the embodiment given below. Components described below include those easily conceivable by those skilled in the art or those substantially identical thereto. In addition, the components described below can be combined as appropriate. What is disclosed herein is merely an example, and the present disclosure naturally encompasses appropriate modifications easily conceivable by those skilled in the art while maintaining the gist of the present disclosure. To further clarify the description, the drawings may schematically illustrate, for example, widths, thicknesses, and shapes of various parts as compared with actual aspects thereof. However, they are merely examples, and interpretation of the present disclosure is not limited thereto. The same component as that described with reference to an already mentioned drawing is denoted by the same reference numeral through the present disclosure and the drawings, and detailed description thereof may not be repeated where appropriate.

In the present specification and claims, in expressing an aspect of disposing another structure on or above a certain structure, a case of simply expressing "on" includes both a case of disposing the other structure immediately on the certain structure so as to contact the certain structure and a case of disposing the other structure above the certain structure with still another structure interposed therebe-tween, unless otherwise specified.

Figure 1B:
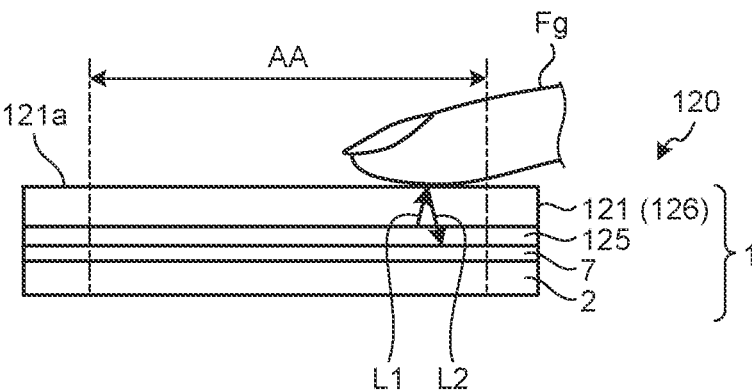
FIG. 1B is a sectional view illustrating a schematic sectional configuration of the detection equipment having an illumination device, the detection equipment including the detection apparatus according to a first modification.
Figure 1C:
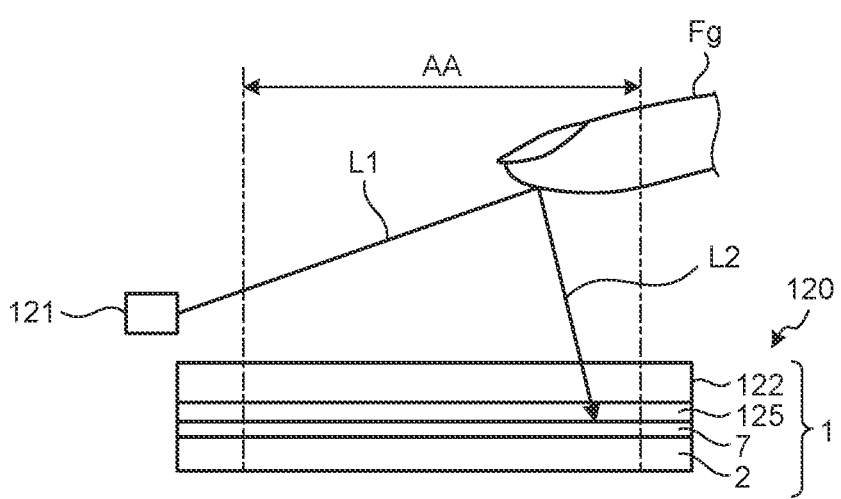
FIG. 1C is a sectional view illustrating a schematic sectional configuration of the detection equipment having an illumination device, the detection equipment including the detection apparatus according to a second modification.
Figure 1D:
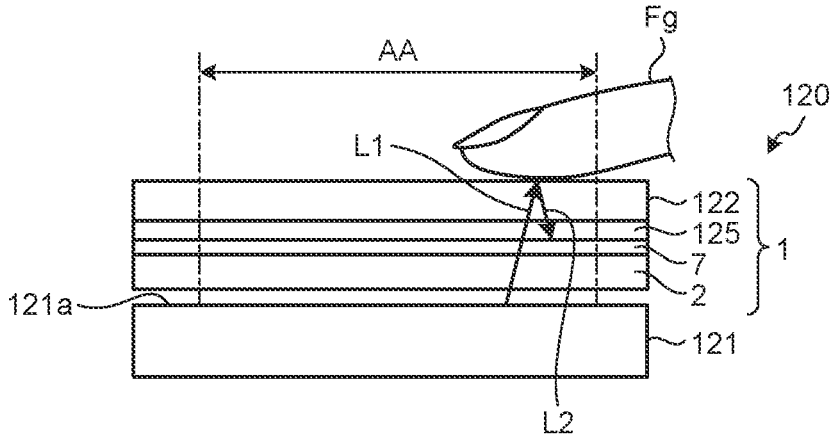
FIG. 1D is a sectional view illustrating a schematic sectional configuration of the detection equipment having an illumination device, the detection equipment including the detection apparatus according to a third modification.

FIG. 1A is a sectional view illustrating a schematic sectional configuration of detection equipment having an illumination device, the detection equipment including a detection apparatus according to an embodiment. FIG. 1B is a sectional view illustrating a schematic sectional configu-ration of the detection equipment having an illumination device, the detection equipment including the detection apparatus according to a first modification. FIG. 1C is a sectional view illustrating a schematic sectional configura-tion of the detection equipment having an illumination device, the detection equipment including the detection apparatus according to a second modification. FIG. 1D is a sectional view illustrating a schematic sectional configura-tion of the detection equipment having an illumination device, the detection equipment including the detection apparatus according to a third modification.

As illustrated in FIG. 1A, detection equipment 120 having an illumination device includes a detection apparatus 1 and an illumination device 121. The detection apparatus 1 includes an array substrate 2, an optical filter 7, an adhesive layer 125, and a cover member 122. That is, the array substrate 2, the optical filter 7, the adhesive layer 125, and the cover member 122 are stacked in this order in a direction orthogonal to a surface of the array substrate 2. As will be describe later, the cover member 122 of the detection apparatus 1 can be replaced with the illumination device 121. The adhesive layer 125 only needs to bond the optical filter 7 to the cover member 122, and the detection apparatus 1 may have a structure without the adhesive layer 125 in an area corresponding to a detection area AA. If the adhesive layer 125 is not provided in the detection area AA, the detection apparatus 1 has a structure in which the adhesive layer 125 bonds the cover member 122 to the optical filter 7 in an area corresponding to a peripheral area GA outside the detection area AA. The adhesive layer 125 provided in the detection area AA may be simply paraphrased as a "protective layer" for the optical filter 7.

As illustrated in FIG. 1A, the illumination device 121 may be, for example, what is called a side light-type front light that uses the cover member 122 as a light guide plate provided in a position corresponding to the detection area AA of the detection apparatus 1 and that includes a plurality of light sources 123 arranged at one end or both ends of the cover member 122. That is, the cover member 122 has a light-emitting surface 121a for emitting light and serves as one component of the illumination device 121. The illumi-nation device 121 emits light L1 from the light-emitting surface 121a of the cover member 122 toward a finger Fg that serves as a detection target. For example, a light-emitting diode (LED) that emits light in a predetermined color is used as a light source.

Alternatively, as illustrated in FIG. 1B, the illumination device 121 may include a light source (such as an LED) provided immediately above the detection area AA of the detection apparatus 1. The illumination device 121 including the light source doubles as the cover member 122.

The illumination device 121 is not limited to the example of FIG. 1B. As illustrated in FIG. 1C, the illumination device 121 may be provided on a lateral side or the upper side of the cover member 122 and may emit the light L1 to the finger Fg from the lateral side of or the upper side of the finger Fg.

Further alternatively, as illustrated in FIG. 1D, the illu-mination device 121 may be what is called a direct-type backlight that includes a light source (such as an LED) provided in the detection area of the detection apparatus 1.

The light L1 emitted from the illumination device 121 is reflected as light L2 by the finger Fg serving as the detection target. The detection apparatus 1 detects the light L2 (a shade of the light L2 or the intensity of the reflected light) reflected by the finger Fg to detect asperities (such as a fingerprint) on a surface of the finger Fg. The detection apparatus 1 may further detect information on a living body by detecting the light L2 reflected in the finger Fg, in addition to detecting the fingerprint. Examples of the infor-mation on the living body include pulsation, pulse waves, and a vascular image of, for example, veins. The color of the light L1 from the illumination device 121 may be changed depending on the detection target.

The cover member 122 is a member for protecting the array substrate 2 and the optical filter 7, and covers the array substrate 2 and the optical filter 7. The illumination device 121 may have a structure to double as the cover member 122, as described above. In the structures illustrated in FIGS. 1C and 1D in which the cover member 122 is separate from the illumination device 121, the cover member 122 is a glass substrate, for example. The cover member 122 is not limited to the glass substrate, and may be, for example, a resin substrate, or may be formed by a plurality of layers obtained by stacking these substrates. The cover member 122 may be omitted. In that case, the surface of the array substrate 2 and the optical filter 7 is provided with a protective layer of an insulating film or the like, and the finger Fg contacts the protective layer of the detection apparatus 1.

The detection equipment 120 having an illumination device may be provided with a display panel 126 instead of the illumination device 121 as illustrated in FIG. 1B. The display panel 126 may be, for example, an organic elec-troluminescent (EL) diode (organic light-emitting diode (OLED)) display panel or an inorganic EL (micro-LED or mini-LED) display. Alternatively, the display panel 126 may be a liquid crystal display (LCD) panel using liquid crystal elements as display elements or an electrophoretic display (EPD) panel using electrophoretic elements as the display elements. In that case, display light (light L1) emitted from the display panel 126 is reflected by the finger Fg, and the reflected light passes through the display panel 126 and reaches the optical filter 7. In view of this fact, the display panel 126 is preferably formed of a substrate or a multilay-ered film that transmits light. The fingerprint of the finger Fg and the information on the living body can be detected based on the light L2.

Figure 2:
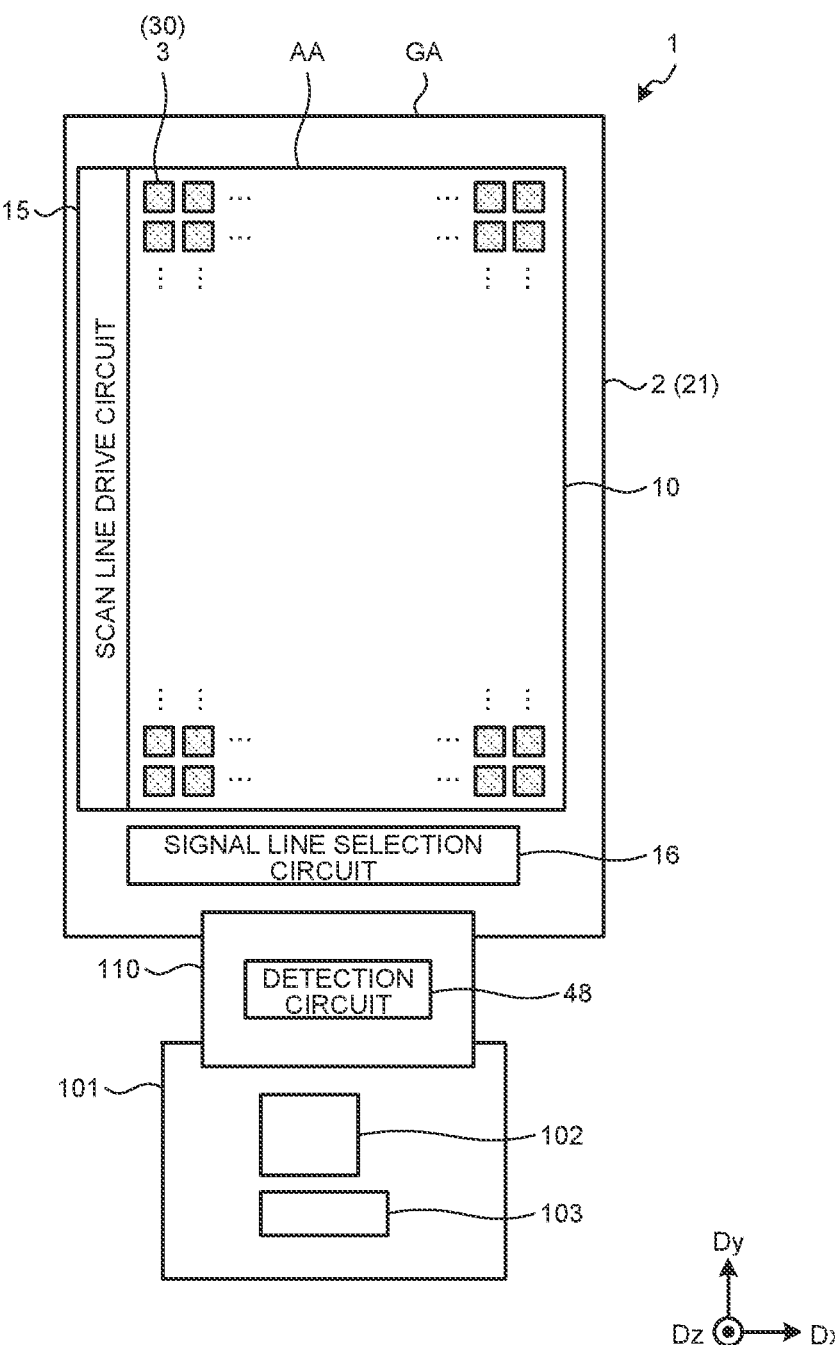
FIG. 2 is a plan view illustrating the detection apparatus according to the embodiment.

FIG. 2 is a plan view illustrating the detection apparatus according to the embodiment. A first direction Dx illustrated in FIG. 2 and the subsequent drawings is one direction in a plane parallel to a substrate 21. A second direction Dy is one direction in the plane parallel to the substrate 21 and is a direction orthogonal to the first direction Dx. The second direction Dy may non-orthogonally intersect the first direc-tion Dx. A third direction Dz is a direction orthogonal to the first direction Dx and the second direction Dy and is a direction normal to the substrate 21. The term "plan view" herein refers to an arrangement relation when viewed in the third direction Dz.

As illustrated in FIG. 2, the detection apparatus 1 includes the array substrate 2 (substrate 21), a sensor 10, a scan line drive circuit 15, a signal line selection circuit 16, a detection circuit 48, a control circuit 102, and a power supply circuit 103.

The substrate 21 is electrically coupled to a control substrate 101 through a wiring substrate 110. The wiring substrate 110 is, for example, a flexible printed circuit board or a rigid circuit board. The wiring substrate 110 is provided with the detection circuit 48. The control substrate 101 is provided with the control circuit 102 and the power supply circuit 103. The control circuit 102 is, for example, a field-programmable gate array (FPGA). The control circuit 102 supplies control signals to the sensor the scan line drive circuit 15, and the signal line selection circuit 16 to control an operation of the sensor The power supply circuit 103 supplies voltage signals including, for example, a power supply potential VDD and a reference potential VCOM (refer to FIG. 4) to the sensor the scan line drive circuit 15, and the signal line selection circuit 16. In the present embodiment, the case is exemplified where the detection circuit 48 is disposed on the wiring substrate 110, but the present disclosure is not limited to this case. The detection circuit 48 may be disposed on the substrate 21.

The substrate 21 has the detection area AA and the peripheral area GA. The detection area AA and the peripheral area GA extend in planar directions parallel to the substrate 21. Each element (detection element 3) of the sensor 10 is provided in the detection area AA. The peripheral area GA is an area outside the detection area AA and is an area not provided with each element (detection element 3). That is, the peripheral area GA is an area between the outer periphery of the detection area AA and the outer edges of the substrate 21. The scan line drive circuit 15 and the signal line selection circuit 16 are provided in the peripheral area GA. The scan line drive circuit 15 is provided in an area extending along the second direction Dy in the peripheral area GA. The signal line selection circuit 16 is provided in an area extending along the first direction Dx in the peripheral area GA and is provided between the sensor 10 and the detection circuit 48.

Each of the detection elements 3 of the sensor 10 is an optical sensor including a photodiode 30 as a sensor element. The photodiode 30 is a photoelectric conversion element and outputs an electrical signal corresponding to light applied to each of the photodiodes 30. More specifically, the photodiode 30 is a positive-intrinsic-negative (PIN) photodiode. The photodiode 30 may be paraphrased as an organic photodiode (OPD). The detection elements 3 are arranged in a matrix having a row-column configuration in the detection area AA. The photodiode 30 included in each of the detection elements 3 performs the detection in accordance with gate drive signals (for example, a reset control signal RST and a read control signal RD) supplied from the scan line drive circuit 15. Each of the photodiodes 30 outputs the electrical signal corresponding to the light applied to the photodiode 30 as a detection signal Vdet to the signal line selection circuit 16. The detection apparatus 1 detects the information on the living body based on the detection signals Vdet from the photodiodes 30.

Figure 3:
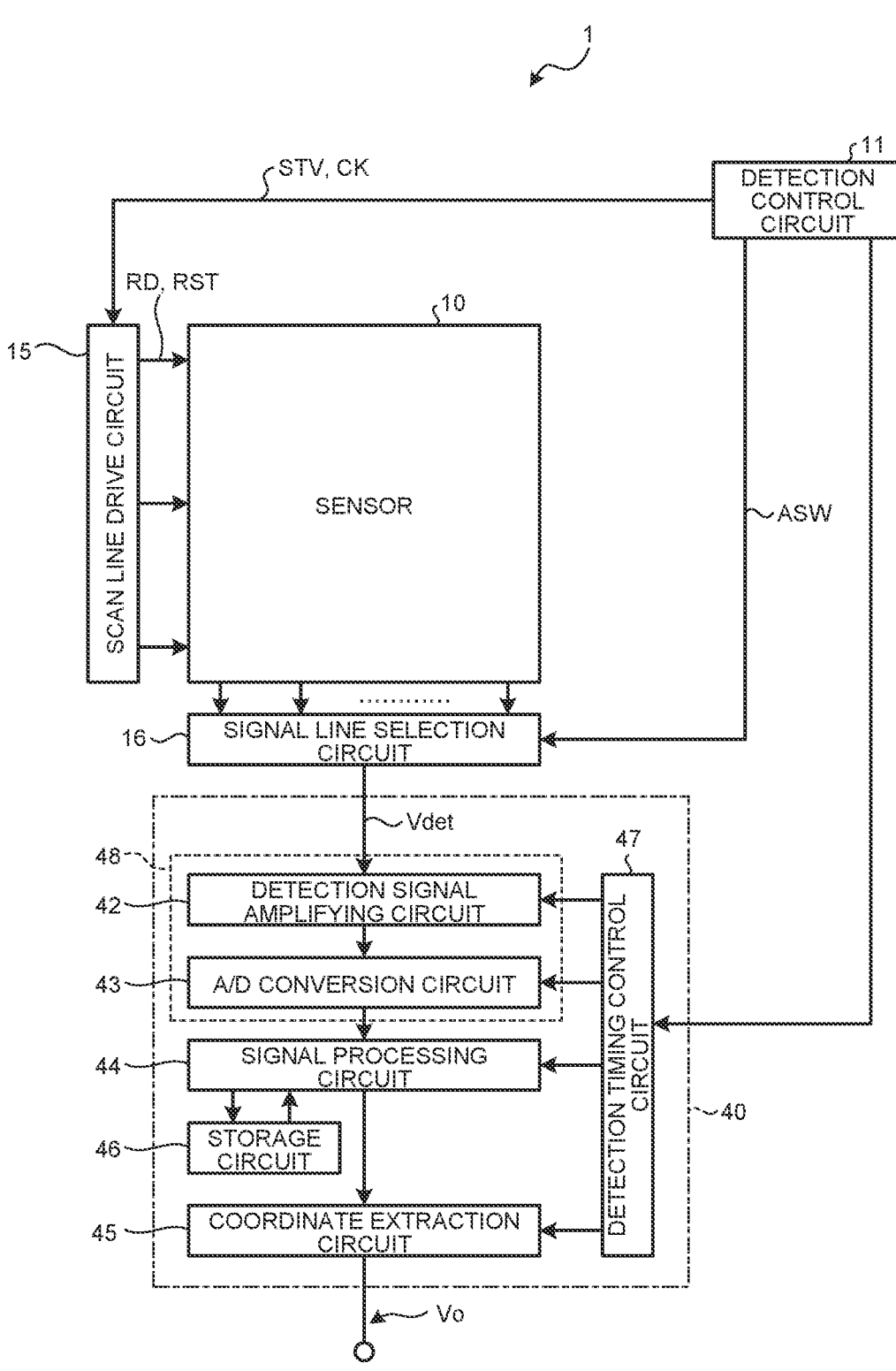
FIG. 3 is a block diagram illustrating a configuration example of the detection apparatus according to the embodiment.

FIG. 3 is a block diagram illustrating a configuration example of the detection apparatus according to the embodiment. As illustrated in FIG. 3, the detection apparatus 1 further includes a detection control circuit 11 and a detector 40. The control circuit 102 includes one, some, or all functions of the detection control circuit 11. The control circuit 102 also includes one, some, or all functions of the detector 40 other than those of the detection circuit 48.

The detection control circuit 11 is a circuit that supplies respective control signals to the scan line drive circuit 15, the signal line selection circuit 16, and the detector 40 to control operations of these components. The detection control circuit 11 supplies various control signals including, for example, a start signal STV and a clock signal CK to the scan line drive circuit 15. The detection control circuit 11 also supplies various control signals including, for example, a selection signal ASW to the signal line selection circuit 16.

The scan line drive circuit 15 is a circuit that drives a plurality of scan lines (a read control scan line GLrd and a reset control scan line GLrst (refer to FIG. 4)) based on the various control signals. The scan line drive circuit 15 sequentially or simultaneously selects the scan lines, and supplies the gate drive signals (for example, the reset control signals RST and the read control signals RD) to the selected scan lines. Through this operation, the scan line drive circuit 15 selects the photodiodes 30 coupled to the scan lines.

Figure 4:
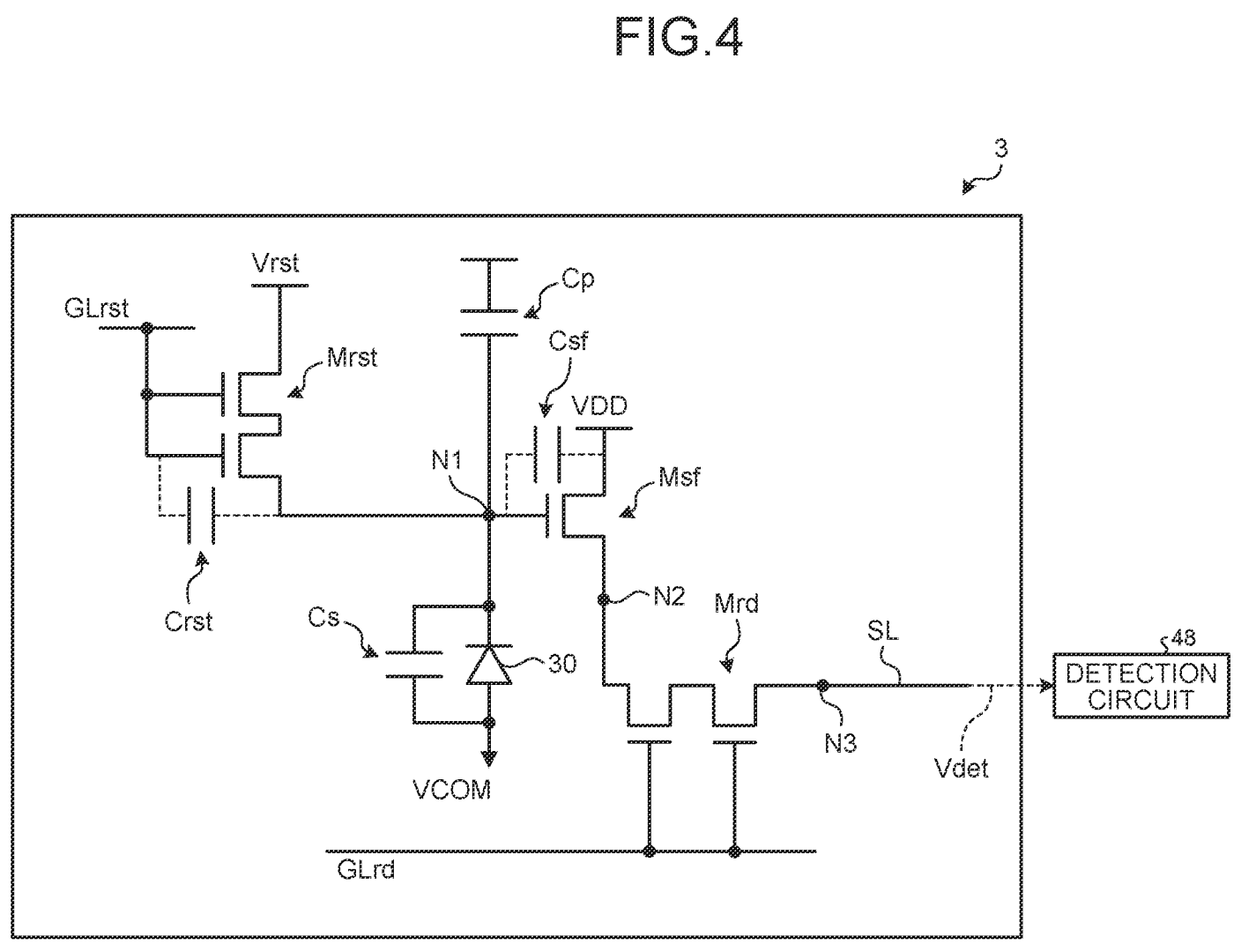

The signal line selection circuit 16 is a switch circuit that sequentially or simultaneously selects a plurality of output signal lines SL (refer to FIG. 4). The signal line selection circuit 16 is, for example, a multiplexer. The signal line selection circuit 16 couples the selected output signal lines SL to the detection circuit 48 based on the selection signal ASW supplied from the detection control circuit 11. Through this operation, the signal line selection circuit 16 outputs the detection signals Vdet of the photodiodes 30 to the detector 40.

The detector 40 includes the detection circuit 48, a signal processing circuit 44, a coordinate extraction circuit 45, a storage circuit 46, and a detection timing control circuit 47. The detection timing control circuit 47 performs control to cause the detection circuit 48, the signal processing circuit 44, and the coordinate extraction circuit 45 to operate in synchronization with one another based on a control signal supplied from the detection control circuit 11.

The detection circuit 48 is, for example, an analog front-end (AFE) circuit. The detection circuit 48 is a signal processing circuit having functions of at least a detection signal amplifying circuit 42 and an analog-to-digital (A/D) conversion circuit 43. The detection signal amplifying circuit 42 amplifies the detection signal Vdet, and is an integration circuit, for example. The A/D conversion circuit 43 converts an analog signal output from the detection signal amplifying circuit 42 into a digital signal.

The signal processing circuit 44 is a logic circuit that detects a predetermined physical quantity received by the sensor 10 based on output signals of the detection circuit 48. The signal processing circuit 44 can detect the asperities (the fingerprint or a palm print) on the surface of the finger Fg or a palm based on the signals from the detection circuit 48 when the finger Fg is in contact with or in proximity to a detection surface. The signal processing circuit 44 may detect the information on the living body based on the signals from the detection circuit 48. Examples of the information on the living body include the vascular image, the pulse waves, the pulsation, and a blood oxygen saturation level of the finger Fg or the palm.

The storage circuit 46 temporarily stores therein signals calculated by the signal processing circuit 44. The storage circuit 46 may be, for example, a random-access memory (RAM) or a register circuit.

The coordinate extraction circuit 45 is a logic circuit that obtains detected coordinates of the asperities on the surface of the finger Fg or the like when the contact or proximity of the finger Fg is detected by the signal processing circuit 44. The coordinate extraction circuit 45 is the logic circuit that also obtains detected coordinates of blood vessels of the finger Fg or the palm. The coordinate extraction circuit 45 combines the detection signals Vdet output from the respective detection elements 3 of the sensor 10 to generate two-dimensional information representing a shape of the asperities on the surface of the finger Fg or the like. The coordinate extraction circuit 45 may output the detection signals Vdet as sensor outputs Vo instead of calculating the detected coordinates.

The following describes a circuit configuration example of the detection apparatus 1. FIG. 4 is a circuit diagram illustrating the detection element. As illustrated in FIG. 4, the detection element 3 includes the photodiode 30, a reset transistor Mrst, a read transistor Mrd, and a source follower transistor Msf. The reset transistor Mrst, the read transistor Mrd, and the source follower transistor Msf are provided correspondingly to each of the photodiodes 30. The reset transistor Mrst, the read transistor Mrd, and the source follower transistor Msf are each made up of an n-type thin-film transistor (TFT). However, each of the transistors is not limited thereto, and may be made up of a p-type TFT.

The reference potential VCOM is applied to the anode of the photodiode 30. The cathode of the photodiode 30 is coupled to a node N1. The node N1 is coupled to a capacitor (capacitance) Cs, one of the source and the drain of the reset transistor Mrst, and the gate of the source follower transistor Msf. The node N1 further has parasitic capacitance Cp and input capacitance Crst and Csf. When light is incident on the photodiode 30, a signal (electric charge) output from the photodiode 30 is stored in the capacitor Cs.

Figure 7:
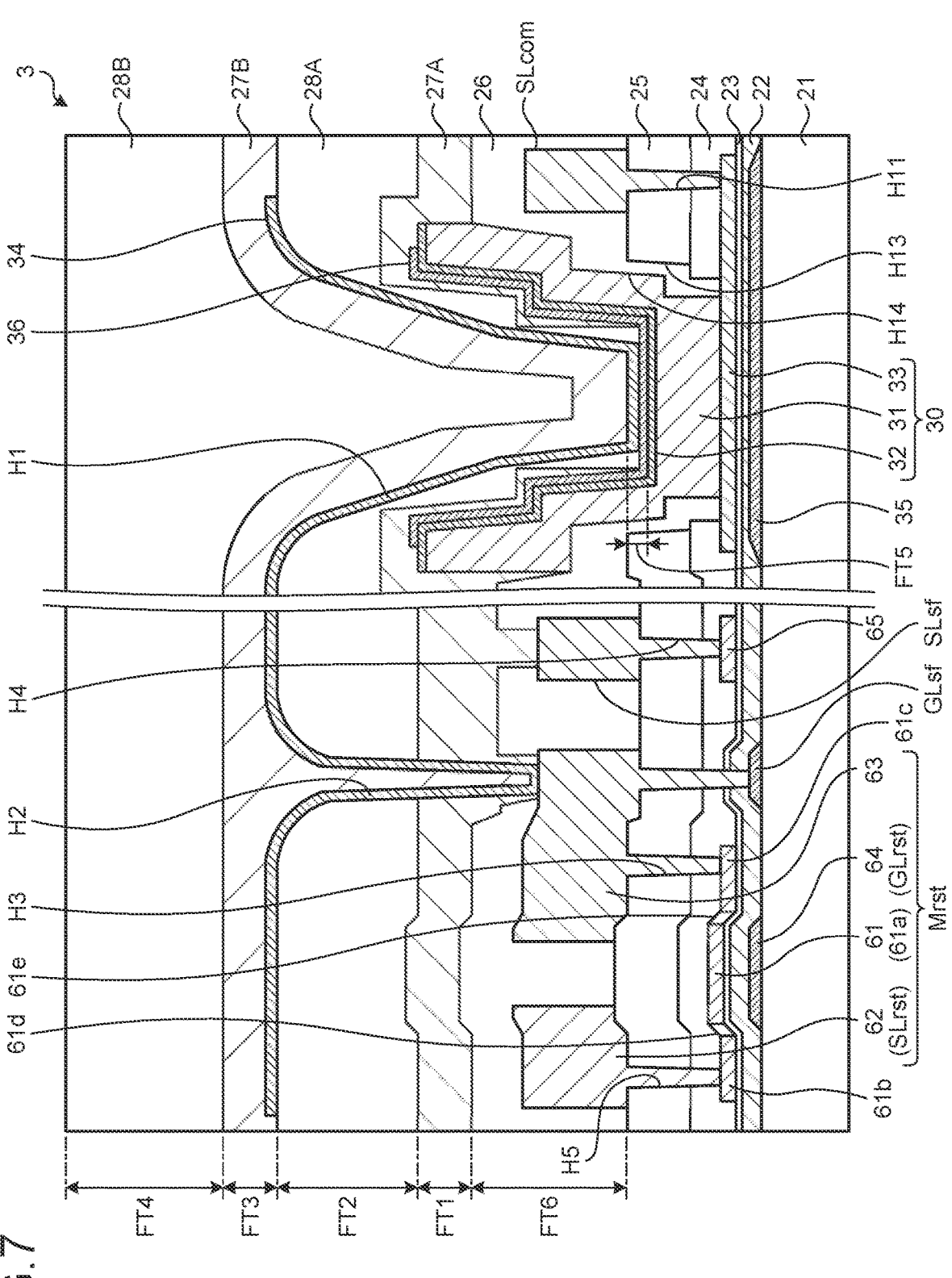
FIG. 7 is a sectional view along VII-VII' of FIG. 6.

The capacitor (capacitance) Cs is, generated between a p-type semiconductor layer 33 and an n-type semiconductor layer 32 of the photodiode 30, for example (refer to FIG. 7). The parasitic capacitance Cp is capacitance added to the capacitance Cs and is generated between various types of wiring and electrodes provided on the array substrate 2. The input capacitance Crst and Csf are capacitance of the reset transistor Mrst and the source follower transistor Msf, respectively, as viewed from input sides thereof, and more specifically, are capacitance obtained by adding the capacitance between the gate and the source to the capacitance between the gate and the drain.

The gate of the reset transistor Mrst is coupled to the reset control scan line GLrst. The other of the source and the drain of the reset transistor Mrst is supplied with a reset potential Vrst. After the reset transistor Mrst is turned on (into a conduction state) in response to the reset control signal RST, the potential of the node N1 is reset to the reset potential Vrst. The reference potential VCOM is lower than the reset potential Vrst, and the photodiode 30 is driven in a reverse bias state.

The source follower transistor Msf is coupled between a terminal supplied with the power supply potential VDD and the read transistor Mrd (node N2). The gate of the source follower transistor Msf is coupled to the node N1. The gate of the source follower transistor Msf is supplied with a signal (electric charge) generated by the photodiode 30. This operation causes the source follower transistor Msf to output a voltage signal corresponding to the signal (electric charge) generated by the photodiode 30 to the read transistor Mrd.

The read transistor Mrd is coupled between the source of the source follower transistor Msf (node N2) and a corresponding one of the output signal lines SL (node N3). The gate of the read transistor Mrd is coupled to the read control scan line GLrd. After the read transistor Mrd is turned on in response to the read control signal RD, the signal output from the source follower transistor Msf, that is, the voltage signal corresponding to the signal (electric charge) generated by the photodiode 30 is output as the detection signal Vdet to the output signal line SL.

In the example illustrated in FIG. 4, the reset transistor Mrst and the read transistor Mrd each have what is called a double-gate structure configured by coupling two transistors in series. However, the reset transistor Mrst and the read transistor Mrd are not limited to this structure and may have a single-gate structure, or a multi-gate structure including three or more transistors coupled in series. The circuit of one detection element 3 is not limited to the configuration including the three transistors of the reset transistor Mrst, the source follower transistor Msf, and the read transistor Mrd. The detection element 3 may include two transistors, or four or more transistors.

Figure 5:
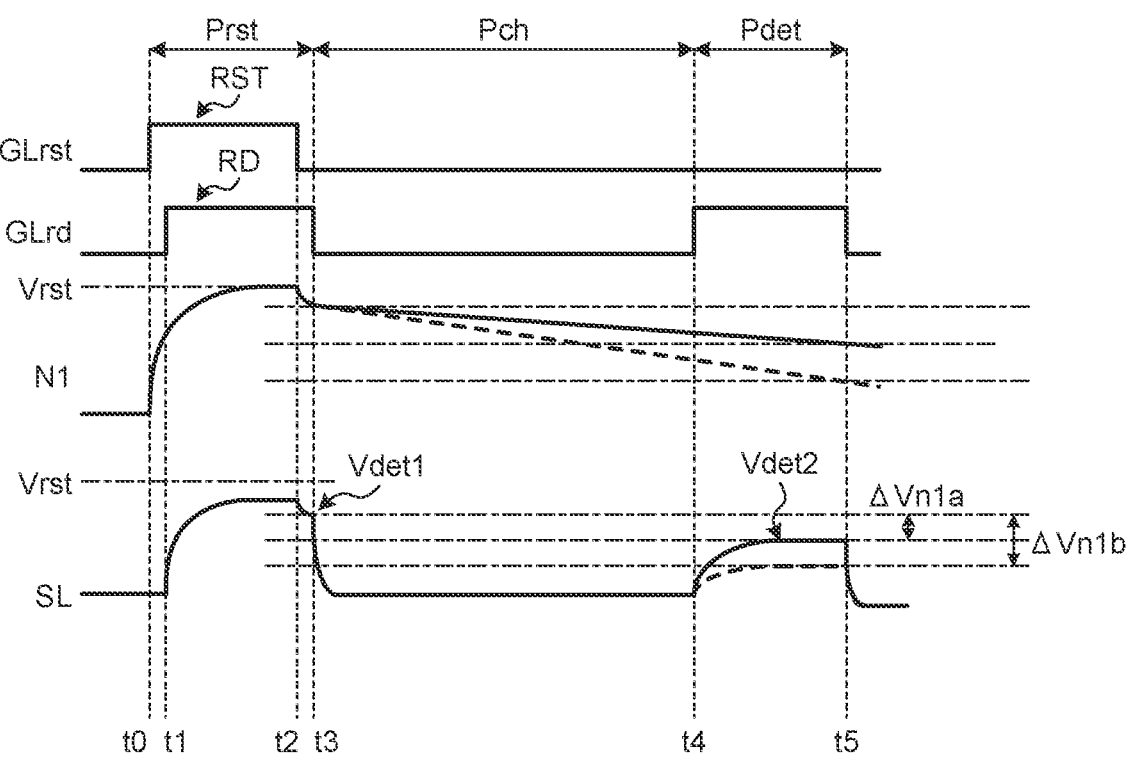
FIG. 5 is a waveform timing chart illustrating an operation example of the detection element.

FIG. 5 is a waveform timing chart illustrating an operation example of the detection element. As illustrated in FIG. 5, the detection element 3 performs the detection in the order of a reset period Prst, an exposure period Pch, and a read period Pdet. The power supply circuit 103 supplies the reference potential VCOM to the anode of the photodiode 30 over the reset period Prst, the exposure period Pch, and the read period Pdet.

At time t0, the control circuit 102 sets the reset control signal RST to be supplied to the reset control scan line GLrst to HIGH (high-level voltage) to start the reset period Prst. In the reset period Prst, the reset transistor Mrst is turned on (into the conduction state), and thus, the potential of the node N1 increases to the reset potential Vrst.

At time t1, the control circuit 102 sets the read control signal RD to be supplied to the read control scan line GLrd to HIGH (high-level voltage). As a result, the read transistor Mrd is turned on (into the conduction state).

At time t2, the control circuit 102 sets the reset control signal RST to LOW (low-level voltage), and thus, the reset period Prst ends. At time t2, the reset transistor Mrst is turned off (into a nonconduction state). Then, the signal corresponding to the light applied to the photodiode 30 is stored to reduce the potential of the node N1 to (Vrst−ΔVn1). The term ΔVn1 denotes a signal (voltage change amount) corresponding to the light applied to the photodiode 30.

At time t3, the potential of the detection signal Vdet output from the output signal line SL reaches (Vrst−Vthsf−Vrdon). The term Vthsf denotes a threshold voltage Vthsf of the source follower transistor Msf. The term Vrdon denotes a voltage drop caused by on-resistance of the read transistor Mrd.

At time t3, the control circuit 102 sets the read control signal RD to LOW (low-level voltage). As a result, the read transistor Mrd is turned off (into the nonconduction state). Thus, the potential of the node N2 is set to be constant, and the potential of the detection signal Vdet output from the output signal line SL is also set to LOW (low-level voltage).

At time t4, the control circuit 102 sets the read control signal RD to HIGH (high-level voltage) again. As a result, the read transistor Mrd is turned on (into the conduction state). Thus, the exposure period Pch ends, and the read period Pdet starts. The potential of a detection signal Vdet2 output during the read period Pdet drops by the amount of the signal ΔVn1 from the potential of the detection signal Vdet1 obtained at time t3 to (Vrst−Vthsf Vrdon−ΔVn1).

The detector 40 can detect the light applied to the photodiode 30 based on the signal (ΔVn1) of the difference between the detection signal Vdet1 at time t3 and the detection signal Vdet2 at time t5. For example, a signal ΔVn1a illustrated in FIG. 5 is a signal (voltage change amount) generated when illuminance is low, and a signal ΔVn1b is a signal (voltage change amount) generated when the illuminance is high. The detection apparatus 1 can detect the intensity of the light L2 for each of the detection elements 3 based on the difference between the signal ΔVn1a and the signal ΔVn1b. For example, the asperities of the fingerprint and the vascular image (vein pattern) of the finger pressing the detection surface can be detected by integrating the detection results of the individual detection elements 3.

While FIG. 5 illustrates the operation example of one of the detection elements 3, the scan line drive circuit 15 can cause the detection elements 3 in the entire detection area AA to perform the detection by sequentially scanning the reset control scan lines GLrst and the read control scan lines GLrd in a time-division manner.

When capacitance Cn1 denotes the total capacitance added to the photodiode 30, the capacitance Cn1 is expressed by Expression (1) below. In Expression (1), the capacitance Cs, the parasitic capacitance Cp, and the input capacitance Crst and Csf are various types capacitance equivalently coupled to the cathode of the photodiode 30 (node N1) described above with reference to FIG. 4.

$$Cn1 = Cs + Crst + Csf + Cp \tag{1}$$

The signal $\Delta Vn1$ is expressed by Expression (2) below. In Expression (2), $\Delta Q$ denotes an electric charge stored during the exposure period Pch; Ip denotes a photocurrent that flows correspondingly to the light applied to the photodiode 30; and T denotes an exposure time (period from time t3 to time t4).

$$\Delta Vn1 = \Delta Q/Cn1 = (Ip \times T)/Cn1 \tag{2}$$

As expressed by Expression (2), the signal $\Delta Vn1$ can be increased by reducing the capacitance Cn1. That is, the detection sensitivity of the detection apparatus 1 is demonstrated to be increasable by reducing the capacitance Cn1 even when the same object to be detected is detected under the same detection conditions.

Figure 6:
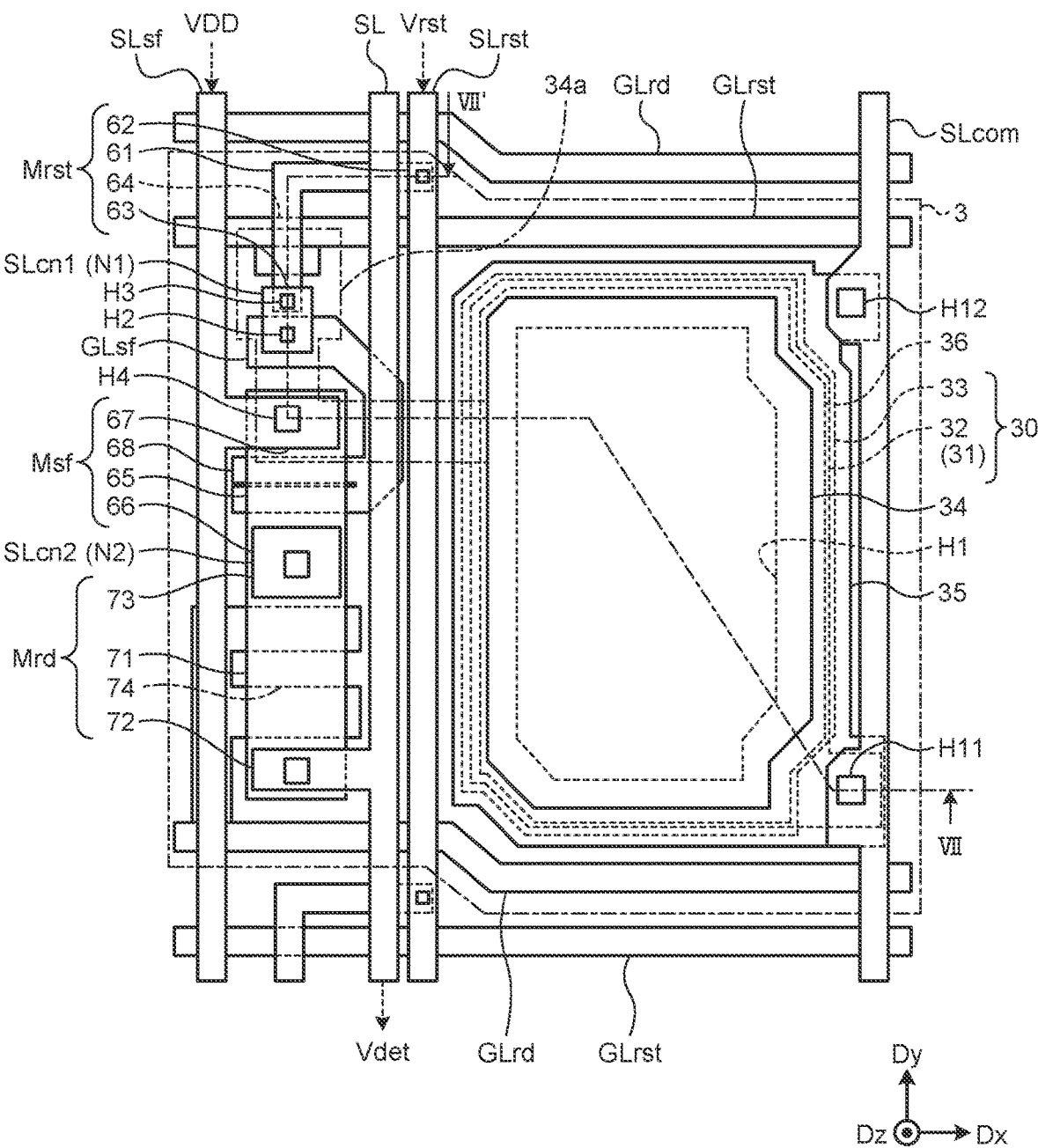
FIG. 6 is a plan view illustrating the detection element.

The following describes a planar configuration and a sectional configuration of the detection element 3. FIG. 6 is a plan view illustrating the detection element. As illustrated in FIG. 6, each of the detection elements 3 includes two scan lines (the read control scan line GLrd and the reset control scan line GLrst) and four signal lines (the output signal line SL, a power supply signal line SLsf, a reset signal line SLrst, and a reference signal line SLcom).

The read control scan line GLrd and the reset control scan line GLrst extend in the first direction Dx, and are arranged in the second direction Dy. The output signal line SL, the power supply signal line SLsf, the reset signal line SLrst, and the reference signal line SLcom extend in the second direction Dy and are arranged in the first direction Dx.

The detection element 3 is defined as an area surrounded by two scan lines (the read control scan line GLrd and the reset control scan line GLrst) and two signal lines (for example, the power supply signal line SLsf and the reference signal line SLcom).

The photodiode 30 is provided in an area surrounded by the read control scan line GLrd, the reset control scan line GLrst, the reset signal line SLrst, and the reference signal line SLcom. The photodiode 30 is configured by including semiconductor layers having a photovoltaic effect. Specifically, the semiconductor layers of the photodiode 30 include an i-type semiconductor layer 31, the n-type semiconductor layer 32, and the p-type semiconductor layer 33. The i-type semiconductor layer 31 and the n-type semiconductor layer 32 are formed of amorphous silicon (a-Si), for example. The p-type semiconductor layer 33 is formed of polysilicon (p-Si), for example. The material of each of the semiconductor layers is not limited to these materials, but may be, for example, polysilicon or microcrystalline silicon.

The a-Si of the n-type semiconductor layer 32 is doped with impurities to form an n+ region. The p-Si of the p-type semiconductor layer 33 is doped with impurities to form a p+ region. The i-type semiconductor layer 31 is, for example, a non-doped intrinsic semiconductor, and has lower conductivity than that of the n-type semiconductor layer 32 and the p-type semiconductor layer 33.

The p-type semiconductor layer 33 is coupled to the reference signal line SLcom through a contact hole H11. With this configuration, the p-type semiconductor layer 33 of the photodiode 30 is supplied with the reference potential VCOM through the reference signal line SLcom.

A lower conductive layer 35 is provided in an area overlapping the semiconductor layers of the photodiode 30. The lower conductive layer 35 is coupled to the reference signal line SLcom through a contact hole H12. With this configuration, the lower conductive layer 35 is supplied with the same reference potential VCOM as that of the p-type semiconductor layer 33, and thus, can reduce the parasitic capacitance between the lower conductive layer 35 and the p-type semiconductor layer 33.

The reset transistor Mrst, the source follower transistor Msf, and the read transistor Mrd are arranged in the second direction Dy. The three transistors arranged in the second direction Dy are arranged so as to be adjacent to the photodiode 30 in the first direction Dx. In other words, the reset transistor Mrst, the source follower transistor Msf, and the read transistor Mrd are provided in an area not overlapping the photodiode 30.

The reset transistor Mrst includes a semiconductor layer 61, a source electrode 62, a drain electrode 63, and a gate electrode 64. One end of the semiconductor layer 61 is coupled to the reset signal line SLrst. The other end of the semiconductor layer 61 is coupled to coupling wiring SLcn1 (node N1) through a contact hole H3. A portion of the reset signal line SLrst coupled to the semiconductor layer 61 serves as the source electrode 62, and a portion of coupling wiring SLcn1 coupled to the semiconductor layer 61 serves as the drain electrode 63. The semiconductor layer 61 intersects the reset control scan line GLrst. A channel area is formed at a portion of the semiconductor layer 61 overlapping the reset control scan line GLrst, and a portion of the reset control scan line GLrst overlapping the semiconductor layer 61 serves as the gate electrode 64.

The source follower transistor Msf includes a semiconductor layer 65, a source electrode 66, a drain electrode 67, and a gate electrode 68. One end of the semiconductor layer 65 is coupled to the power supply signal line SLsf through a contact hole H4. The other end of the semiconductor layer 65 is coupled to coupling wiring SLcn2 (node N2). A portion of the power supply signal line SLsf coupled to the semiconductor layer 65 serves as the drain electrode 67, and a portion of the coupling wiring SLcn2 (node N2) coupled to the semiconductor layer 65 serves as the source electrode 66.

One end of a gate line GLsf is coupled to the coupling wiring SLcn1 through a contact hole. The other end side of the gate line GLsf is branched into two portions, which are, in turn, provided to be arranged in the second direction Dy. The semiconductor layer 65 intersects the gate line GLsf branched into the two portions. The portions of the gate line GLsf overlapping the semiconductor layer 65 serve as the gate electrode 68. That is, the reset transistor Mrst is electrically coupled to the gates of the source follower transistor Msf through the gate line GLsf.

An upper conductive layer 34 provided on the photodiode 30 is coupled to coupling wiring 34a indicated by a long dashed double-short dashed line. The coupling wiring 34a is coupled to the coupling wiring SLcn1 through a contact hole H2. With this configuration, the cathode (n-type semiconductor layer 32) of the photodiode 30 is electrically coupled to the reset transistor Mrst and the source follower transistor Msf through the coupling wiring SLcn1. For example, a multilayered structure of molybdenum (Mo) and aluminum (Al) can be employed as the coupling wiring 34a. However, the coupling wiring 34a is not limited thereto and may be made of another metal material, and the upper conductive layer 34 and the coupling wiring 34a may be integrally formed of a light-transmitting conductive material such as indium tin oxide (ITO).

The read transistor Mrd includes a semiconductor layer 71, a source electrode 72, a drain electrode 73, and gate electrodes 74. One end of the semiconductor layer 71 is coupled to the coupling wiring SLcn2 (node N2). The other end of the semiconductor layer 71 is coupled to the output signal line SL. In other words, a portion of the coupling wiring SLcn2 (node N2) coupled to the semiconductor layer 71 serves as the drain electrode 73, and a portion of the output signal line SL coupled to the semiconductor layer 71 serves as the source electrode 72. The read control scan line GLrd has two branched portions provided to be arranged in the second direction Dy. The semiconductor layer 71 intersects the two branched portions of the read control scan line GLrd. The portions of the read control scan line GLrd overlapping the semiconductor layer 71 serve as the gate electrodes 74. With the above-described configuration, the source follower transistor Msf and the read transistor Mrd are coupled to the output signal line SL.

The planar configuration of the photodiode 30 and the transistors illustrated in FIG. 6 is merely an example, and can be changed as appropriate. For example, the transistors are not limited to being arranged in the second direction Dy. One or some of the transistors may be provided in a different position or different positions, for example, by being arranged so as to be adjacent to another transistor in the first direction Dx.

FIG. 7 is a sectional view along VII-VII' of FIG. 6. While FIG. 7 illustrates a sectional configuration of the reset transistor Mrst among the three transistors included in the detection element 3, each of the source follower transistor Msf and the read transistor Mrd also has a sectional configuration similar to that of the reset transistor Mrst.

The substrate 21 is an insulating substrate, and a glass substrate of, for example, quartz or alkali-free glass, or a resin substrate of, for example, polyimide is used as the substrate 21. The gate electrode 64 is provided on the substrate 21. Insulating films 22 and 23 are provided on the substrate 21 so as to cover the gate electrode 64. The insulating films 22 and 23 and insulating films 24, 25, and 26 are inorganic insulating films and are formed of, for example, silicon oxide (SiO₂) or silicon nitride (SiN).

The semiconductor layer 61 is provided on the insulating film 23. The semiconductor layer 61 is, for example, polysilicon. The semiconductor layer 61 is, however, not limited thereto and may be formed of, for example, a microcrystalline oxide semiconductor, an amorphous oxide semiconductor, or low-temperature polycrystalline silicon (LTPS). The gate electrode 64 faces the semiconductor layer 61 with the insulating films 22 and 23 (gate insulating films) interposed therebetween. The reset transistor Mrst has a bottom-gate structure in which the gate electrode 64 is provided on the lower side of the semiconductor layer 61, but may have a top-gate structure in which the gate electrode 64 is provided on the upper side of the semiconductor layer 61, or a dual-gate structure in which the gate electrodes 64 are provided on the upper side and lower side of the semiconductor layer 61.

The semiconductor layer 61 includes a channel region 61a, high-concentration impurity regions 61b and 61c, and low-concentration impurity regions 61d and 61e. The channel region 61a is, for example, a non-doped intrinsic semiconductor or a low-impurity region, and has lower conductivity than that of the high-concentration impurity regions 61b and 61c and the low-concentration impurity regions 61d and 61e. The channel region 61a is provided in an area overlapping the gate electrode 64.

The insulating films 24 and 25 are provided on the insulating film 23 so as to cover the semiconductor layer 61. The source electrode 62 and the drain electrode 63 are provided on the insulating film 25. The source electrode 62 is coupled to the high-concentration impurity region 61b of the semiconductor layer 61 through a contact hole H5. The drain electrode 63 is coupled to the high-concentration impurity region 61c of the semiconductor layer 61 through the contact hole H3. The source and the drain electrodes 62 and 63 are formed of, for example, a multilayered film of Ti—Al—Ti layers or Ti—Al layers that has a multilayered structure of titanium and aluminum.

The gate line GLsf coupled to the gate of the source follower transistor Msf is provided in the same layer as that of the gate electrode 64. The drain electrode 63 (coupling wiring SLcn1) of the reset transistor Mrst is coupled to the gate line GLsf through a contact hole passing through the insulating films 22 to 25.

The semiconductor layer 65 of the source follower transistor Msf is provided in the same layer as that of the semiconductor layer 61. The power supply signal line SLsf is provided in the same layer as that of the source electrode 62 (reset signal line SLrst) and the drain electrode 63 (coupling wiring SLcn1). The power supply signal line SLsf is coupled to the semiconductor layer 65 through the contact hole H4 passing through the insulating films 24 and 25.

The following describes a sectional configuration of the photodiode 30. The lower conductive layer 35 is provided in the same layer as that of the gate electrode 64 and the gate line GLsf on the substrate 21. The insulating films 22 and 23 are provided on the lower conductive layer 35. The photodiode 30 is provided on the insulating film 23. In other words, the lower conductive layer 35 is provided between the substrate 21 and the p-type semiconductor layer 33. The lower conductive layer 35 is formed of the same material as that of the gate electrode 64 to serve as a light-blocking layer, and thus, the lower conductive layer 35 can reduce light entering the photodiode 30 from the substrate 21 side. As illustrated in FIGS. 6 and 7, in this example, the photodiode 30 fully overlaps the lower conductive layer 35 in plan view, thus having no area that does not overlap the lower conductive layer 35. In contrast, a configuration can be employed in which a portion of the outer edge of the photodiode 30 is located outside the lower conductive layer 35 in plan view.

The i-type semiconductor layer 31 is provided between the p-type semiconductor layer 33 and the n-type semiconductor layer 32 in a direction orthogonal to a surface of the substrate 21 (in the third direction Dz). In the present embodiment, the p-type semiconductor layer 33, the i-type semiconductor layer 31, and the n-type semiconductor layer 32 are stacked on the insulating film 23 in the order as listed.

Specifically, the p-type semiconductor layer 33 is provided in the same layer as the semiconductor layers 61 and 65 on the insulating film 23. The insulating films 24, 25, and 26 are provided so as to cover the p-type semiconductor layer 33. The insulating films 24 and 25 are provided with a contact hole H13 in a position overlapping the p-type semiconductor layer 33. The insulating film 26 is provided on the insulating film 25 so as to cover the transistors including the reset transistor Mrst. The insulating film 26 covers side surfaces of the insulating films 24 and 25 constituting an inner wall of the contact hole H13. The insulating film 26 is provided with a contact hole H14 in a position overlapping the p-type semiconductor layer 33.

The i-type semiconductor layer 31 is provided on the insulating film 26 and is coupled to the p-type semiconductor layer 33 through the contact hole H14 passing through the insulating films 24 to 26. The n-type semiconductor layer 32 is provided on the i-type semiconductor layer 31. Specifically, an upper surface of the p-type semiconductor layer 33 is in contact with the i-type semiconductor layer 31 and is also in contact with the insulating film 26. A lower surface of the i-type semiconductor layer 31 is in contact with the p-type semiconductor layer 33, and side surfaces (outer side surfaces) of the i-type semiconductor layer 31 are in contact with the insulating film 26 and a first inorganic insulating film 27A. The lower surface of the n-type semiconductor layer 32 is in contact with the upper surface of the i-type semiconductor layer 31.

An intermediate conductive layer 36 is provided in contact with the upper surface of the n-type semiconductor layer 32 of the photodiode 30. The intermediate conductive layer 36 is provided in an island pattern above the contact hole H14 and serves as an etching stopper when forming a contact hole H1 that is formed so as to overlap the contact hole H14. That is, the intermediate conductive layer 36 restrains the photodiode 30 from being etched when forming the contact hole H1. The intermediate conductive layer 36 is provided at least in an area overlapping the bottom of the contact hole H1. The intermediate conductive layer 36 is made using a light-transmitting conductive material such as ITO. In this example, the intermediate conductive layer 36 fully overlaps the n-type semiconductor layer 32 in plan view, and the outer edge of the intermediate conductive layer 36 is located inside the outer edge of the n-type semiconductor layer 32 in plan view, but these locations may be interchanged. That is, a configuration may also be employed in which the outer edge of the n-type semiconductor layer 32 is located inside the outer edge of the intermediate conductive layer 36. The configuration is not limited thereto and may be such that the outer edges of the p-type semiconductor layer 33 and the i-type semiconductor layer 31 are located inside the intermediate conductive layer 36.

The first inorganic insulating film 27A is provided on the insulating film 26 so as to cover the photodiode 30 and the intermediate conductive layer 36. The first inorganic insulating film 27A is provided so as to be directly in contact with the photodiode 30, the insulating film 26, and the intermediate conductive layer 36. More specifically, the peripheral wall of the contact hole H14 is covered by the multilayered configuration of the n-type semiconductor layer 32 and the intermediate conductive layer 36, and the first inorganic insulating film 27A covers the intermediate conductive layer 36 that is the outermost surface of the multilayered configuration in the contact hole H14. The first inorganic insulating film 27A is formed of, for example, silicon oxide (SiO$_2$) or silicon nitride (SiN). The first inorganic insulating film 27A is provided as a passivation film that restrains water from entering the photodiode 30. In more detail, since the first inorganic insulating film 27A is provided between a first organic insulating film 28A and the photodiode 30, water can be restrained from entering the photodiode 30 from first organic insulating film 28A.

The first organic insulating film 28A is provided on the first inorganic insulating film 27A. The first organic insulating film 28A is formed of an organic material such as photosensitive acrylic. The first organic insulating film 28A is thicker than the insulating film 26 and the first inorganic insulating film 27A. The first organic insulating film 28A has a better step covering property than that of inorganic insulating materials, and is provided so as to cover steps of the first inorganic insulating film 27A (steps formed by the i-type and the n-type semiconductor layers 31 and 32 and the insulating film 26). The first organic insulating film 28A is provided also inside the contact hole H14 and covers the first inorganic insulating film 27A covering the peripheral wall of the contact hole H14. While the steps described above are also formed in the contact hole and at the periphery of the upper opening thereof, the first organic insulating film 28A smoothly covers the steps without causing step disconnection or the like.

With the configuration described above, the i-type semiconductor layer 31, the n-type semiconductor layer 32, and the intermediate conductive layer 36 are stacked in this order in the contact hole H14, and in addition, the first inorganic insulating film 27A and the first organic insulating film 28A cover the intermediate conductive layer 36 in this order. The contact hole H1 is formed through the bottoms of the first inorganic insulating film 27A and the first organic insulating film 28A in the contact hole H14, and the intermediate conductive layer 36 is exposed through the contact hole H1.

The upper conductive layer 34 is provided on the first organic insulating film 28A. The upper conductive layer 34 is made of a light-transmitting conductive material such as ITO. The upper conductive layer 34 is provided along a surface of the first organic insulating film 28A and is electrically coupled to the n-type semiconductor layer 32 through the contact hole H1 passing through the first inorganic insulating film 27A and the first organic insulating film 28A in the thickness direction of these insulating films. In more detail, the upper conductive layer 34 contacts the intermediate conductive layer 36 at the bottom (bottom opening) of the contact hole H1, being thereby electrically coupled to the n-type semiconductor layer 32. In an area overlapping the bottom of contact hole H1, the intermediate conductive layer 36 and the upper conductive layer 34 are stacked in this order on the n-type semiconductor layer 32. Furthermore, in an area on an upper surface of the photodiode 30 where the contact hole H1 is not provided, the intermediate conductive layer 36, the first inorganic insulating film 27A, and the first organic insulating film 28A are stacked on the n-type semiconductor layer 32. This configuration can effectively restrain water from entering the photodiode 30. A configuration can be employed in which the first organic insulating film 28A is not provided in the contact hole H14.

The upper conductive layer 34 (coupling wiring 34a) is electrically coupled to the drain electrode 63 of the reset transistor Mrst and the gate line GLsf through the contact hole H2 provided in the first inorganic insulating film 27A and the first organic insulating film 28A. In the present embodiment, since the intermediate conductive layer 36 is provided as the etching stopper, the contact holes H1 and H2 can be formed in the same process while reducing damage to the photodiode 30.

A second inorganic insulating film 27B is provided on the first organic insulating film 28A so as to cover the upper conductive layer 34. A second organic insulating film 28B is provided on the second inorganic insulating film 27B. The second inorganic insulating film 27B is provided as a protective layer to restrain water from entering the photodiode 30. In more detail, the second inorganic insulating film 27B restrains penetration of water from an end on the peripheral side of the array substrate 2 and penetration of water from the second organic insulating film 28B and a surface side of the array substrate 2. The second organic insulating film 28B is an organic protective film. The second organic insulating film 28B is formed to planarize a surface of the detection apparatus 1.

The same inorganic material as the first inorganic insulating film 27A is used as the second inorganic insulating film 27B. The same organic material as the first organic insulating film 28A is used as the second organic insulating film 28B. However, a different inorganic material from the first inorganic insulating film 27A may be used as the second inorganic insulating film 27B. A different organic material from the first organic insulating film 28A may be used as the second organic insulating film 28B.

A film thickness FT1 of the first inorganic insulating film 27A is larger than a film thickness FT3 of the second inorganic insulating film 27B. The film thickness FT1 of the first inorganic insulating film 27A is larger than a total film thickness FT5 of the upper conductive layer 34 and the intermediate conductive layer 36. A film thickness FT2 of the first organic insulating film 28A and a film thickness FT4 of the second organic insulating film 28B are larger than the film thickness FT1 of the first inorganic insulating film 27A and the film thickness FT3 of the second inorganic insulating film.

In more detail, the film thickness FT1 of the first inorganic insulating film 27A is, for example, approximately 100 nm to 500 nm, for example, approximately 300 nm. The film thickness FT2 of the first organic insulating film 28A is, for example, approximately 1500 nm to 3000 nm, for example, approximately 2000 nm. The film thickness FT3 of the second inorganic insulating film 27B is, for example, approximately 100 nm to 500 nm, for example, approximately 300 nm. The film thickness FT4 of the second organic insulating film 28B is, for example, approximately 1500 nm to 4000 nm, for example, approximately 3000 nm. The total film thickness FT5 of the upper conductive layer 34 and the intermediate conductive layer 36 is, for example, approximately 100 nm to 200 nm, for example, approximately 100 nm. The film thickness FT6 of the insulating film 26 is, for example, approximately 300 nm to 500 nm, for example, approximately 400 nm.

As described above, the detection apparatus 1 of the present embodiment includes the substrate 21, the photodiodes 30, the transistors provided for the respective photodiodes 30, the insulating film 26 provided on the upper side of the substrate 21 so as to cover the transistors, the first inorganic insulating film 27A provided on the upper side of the insulating film 26 so as to cover the photodiodes 30, the first organic insulating film 28A provided on the upper side of the first inorganic insulating film 27A, and the upper conductive layer 34. The photodiodes 30 are arranged on the substrate 21 and each include the p-type semiconductor layer 33, the i-type semiconductor layer 31, and the n-type semiconductor layer 32 stacked on the substrate 21. The upper conductive layer 34 is provided on the upper side of the first organic insulating film 28A and is electrically coupled to the photodiode 30 through the contact hole H1 passing through the first inorganic insulating film 27A and the first organic insulating film 28A in the thickness direction of these insulating films.

In the present embodiment, the first inorganic insulating film 27A and the first organic insulating film 28A are stacked between the photodiode 30 and the upper conductive layer 34. Therefore, the distance of the upper conductive layer 34 to the various types of wiring and the p-type semiconductor layer 33 provided on the array substrate 2 is larger than in a configuration in which only one of the first inorganic insulating film 27A and the first organic insulating film 28A is provided so as to cover the photodiode 30, and thus, the parasitic capacitance of the upper conductive layer 34 can be reduced. Furthermore, the first inorganic insulating film 27A is provided between the first organic insulating film 28A and the photodiode 30 to restrain the penetration of water from the first organic insulating film 28A to the photodiode 30. As a result, a leakage current that would be caused due to the penetration of water to the photodiode 30 can be restrained from increasing. Therefore, the detection apparatus 1 can improve the detection sensitivity compared with the configuration in which one of the first inorganic insulating film 27A and the first organic insulating film 28A is provided between the photodiode 30 and the upper conductive layer 34.

In the present embodiment, since the p-type semiconductor layer 33 and the lower conductive layer 35 of the photodiode 30 are provided in the same layers as those of the semiconductor layer 61 and the gate electrode 64 of the other transistors, the manufacturing process can be simplified compared with a case where the photodiode 30 is formed in layers different from the other transistors. The intermediate conductive layer 36 and the first inorganic insulating film 27A are doubly provided so as to cover the photodiode 30. The second inorganic insulating film 27B is further provided on the upper side of the first inorganic insulating film 27A. A total of three layers formed of the intermediate conductive layer 36, the first inorganic insulating film 27A, and the second inorganic insulating film 27B restrain the penetration of water to the photodiode 30.

Figure 8:
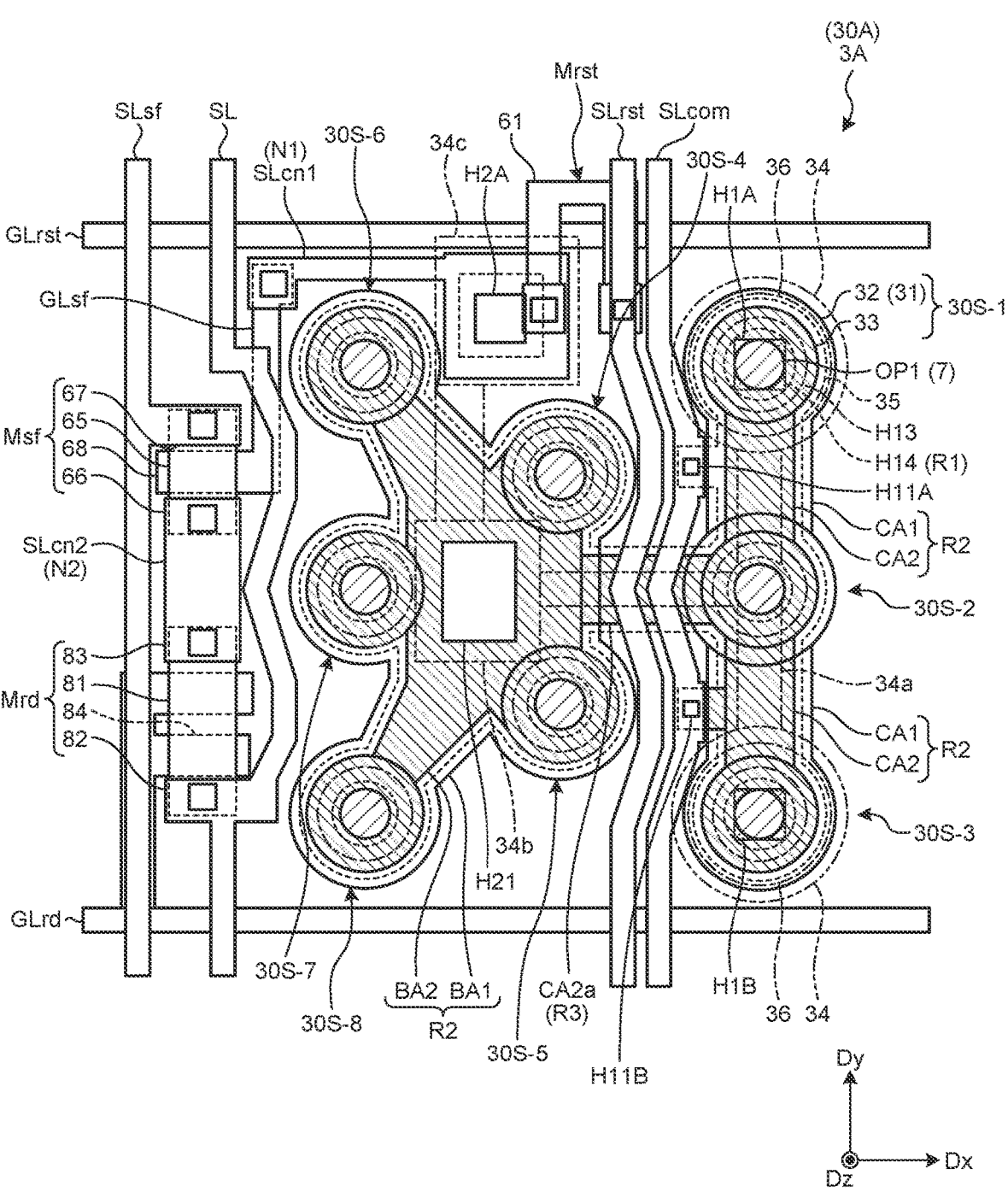
FIG. 8 is a plan view illustrating a detection element according to a fourth modification.

FIG. 8 is a plan view illustrating a detection element according to a fourth modification. In the following description, the same components as those described in the embodiment described above are denoted by the same reference numerals, and the description thereof will not be repeated. As illustrated in FIG. 8, a photodiode 30A includes a plurality of partial photodiodes 30S-1, 30S-2, . . . , 30S-8. The partial photodiodes 30S-1, 30S-2, . . . , 30S-8 are arranged in a triangular lattice pattern.

A lens (not illustrated) and an opening OP1 of a light-blocking layer included in the optical filter 7 (refer to FIGS. 1A to 1D) are provided for each of the partial photodiodes 30S-1, 30S-2, . . . , 30S-8 so as to overlap a corresponding one of the partial photodiodes.

More specifically, the partial photodiodes 30S-1, 30S-2, and 30S-3 are arranged in the second direction Dy. The partial photodiodes 30S-4 and 30S-5 are arranged in the second direction Dy and are adjacent to an element column including the partial photodiodes 30S-1, 30S-2, and 30S-3 in the first direction Dx. The partial photodiodes 30S-6, and 30S-8 are arranged in the second direction Dy and are adjacent to an element column including the partial photodiodes 30S-4 and 30S-5 in the first direction Dx. The positions in the second direction Dy of the partial photodiodes 30S are arranged in a staggered manner between adjacent element columns.

The light L2 is incident on each of the partial photodiodes 30S-1, 30S-2, . . . , 30S-8 through the optical filter 7. The partial photodiodes 30S-1, 30S-2, . . . , 30S-8 are electrically coupled together to serve as one photodiode 30A. That is, signals output from the respective partial photodiodes 30S-1, 30S-2, . . . , 30S-8 are integrated to output one detection signal Vdet from the photodiode 30A. In the following description, the partial photodiodes 30S-1, 30S-2, . . . , 30S-8 will each be simply referred to as "partial photodiode 30S" when need not be distinguished from one another.

The partial photodiode 30S is formed in a circular shape or a semi-circular shape in plan view. The shape of the partial photodiode 30S is, however, not limited thereto, but may be a polygonal shape, for example. The partial photodiodes 30S may have shapes different from one another.

Each of the partial photodiodes 30S includes the i-type semiconductor layer 31, the n-type semiconductor layer 32, and the p-type semiconductor layer 33. The sectional configuration of each of the partial photodiodes 30S is the same as that of the photodiode 30 illustrated in FIG. 7, although not illustrated in the drawings. Each of the partial photodiodes 30S includes at least a first region R1 (the innermost one of dotted circles in each of the partial photodiodes in FIG. 8). The first region R1 is an effective sensor region where the p-type semiconductor layer 33 and the i-type semiconductor layer 31 (and the n-type semiconductor layer 32) overlap one another and are directly coupled together. In other words, the first regions R1 are arranged in a triangular lattice pattern in plan view.

The n-type semiconductor layers 32 of the partial photodiodes 30S-1, 30S-2, and 30S-3 arranged in the second direction Dy are electrically coupled together by a coupling portion CA1. The p-type semiconductor layers 33 of the partial photodiodes 30S-1, 30S-2, and 30S-3 are electrically coupled together by a coupling portion CA2.

The n-type semiconductor layers 32 (i-type semiconductor layers 31) of the partial photodiodes 30S-4, 30S-6, 30S-7, and 30S-8 are electrically coupled together by a base portion BA1. The p-type semiconductor layers 33 of the partial photodiodes 30S-4, 30S-5, 30S-6, and 30S-8 are electrically coupled together by a base portion BA2. The base portions BA1 and BA2 are each formed in a substantially pentagonal shape, and are provided, in the apical positions thereof, with the partial photodiodes 30S-4, 30S-5, 30S-6, 30S-7, and 30S-8.

In other words, a second region R2 is provided between the first regions R1. In the second region R2, at least the p-type semiconductor layer 33 (the coupling portion CA2 and the base portion BA2) and the i-type semiconductor layer 31 (the coupling portion CA1 and the base portion BA1) are stacked so as to be separate from each other in a direction orthogonal to the substrate 21 (in the third direction Dz). More specifically, the second region R2 includes the insulating films 24, 25, and 26 provided between the p-type semiconductor layer 33 and the i-type semiconductor layer 31 (refer to FIG. 7). The second region R2 is, however, not limited to this configuration and may include one or two layers of insulating films or four or more layers of insulating films between the p-type semiconductor layer 33 and the i-type semiconductor layer 31.

The base portion BA1 is disposed so as to be separate from the i-type semiconductor layers 31 and the n-type semiconductor layers 32 of the partial photodiodes 30S-1, and 30S-3 in the first direction Dx. In contrast, the base portion BA2 coupled to the p-type semiconductor layers 33 of the partial photodiodes 30S-4, 30S-5, 30S-6, and 30S-8 is electrically coupled to the p-type semiconductor layers 33 of the partial photodiodes 30S-1, and 30S-3 by a coupling portion CA2a (third region R3) passing below the reset signal line SLrst and the reference signal line SLcom along the first direction Dx. This configuration electrically couples together the partial photodiodes 30S included in the one photodiode 30A. In the third region R3, the p-type semiconductor layer 33 is provided, and the i-type and the n-type semiconductor layers 31 and 32 are provided so as not to overlap the p-type semiconductor layer 33.

The lower conductive layer 35 is provided in an area overlapping the partial photodiodes 30S, the coupling portions CA1, CA2, and CA2a, and the base portions BA1 and BA2. The upper conductive layer 34 electrically couples together the n-type semiconductor layers 32 of the partial photodiodes 30S. Specifically, the upper conductive layer 34 is electrically coupled to the n-type semiconductor layers 32 of the partial photodiodes 30S-1 and 30S-3 in positions overlapping therewith, through contact holes H1A and H1B. The partial photodiodes 30S-1 and 30S-3 coupled to the upper conductive layer 34 are each provided with the intermediate conductive layer 36.

The coupling wiring 34a of the upper conductive layer 34 is formed in a T-shape so as to overlap the coupling portions CA1, CA2, CA2a, and the partial photodiode 30S-2 and is coupled to a coupling portion 34b. The coupling portion 34b of the upper conductive layer 34 is electrically coupled to the n-type semiconductor layer 32 of the base portion BA1 in a position overlapping the base portion BA1, through a contact hole H21.

Furthermore, the upper conductive layer 34 extends from the coupling portion 34b to an area not overlapping the photodiode 30A and is coupled to a coupling portion 34c. The coupling portion 34c of the upper conductive layer 34 is electrically coupled to the transistors (the reset transistor Mrst and the source follower transistor Msf) through a contact hole H2A. The upper conductive layer 34 may be provided in any manner, for example, may be provided so as to partially cover the partial photodiodes or entirely cover the partial photodiodes 30S.

The reset transistor Mrst, the source follower transistor Msf, and the read transistor Mrd are provided in an area not overlapping the photodiode 30A. The configuration of the reset transistor Mrst, the source follower transistor Msf, and the read transistor Mrd is the same as that in FIG. 6, and will not be described in detail.

The output signal line SL is disposed between where the source follower transistor Msf and the read transistor Mrd are located and where the partial photodiodes 30S-6, and 30S-8 are located. The output signal line SL is provided in a zig-zag manner along the partial photodiodes 30S-7, and 30S-8.

The reset signal line SLrst and the reference signal line SLcom are arranged between the partial photodiodes 30S-2, 30S-3 and the partial photodiodes 30S-4, 30S-5. The reset signal line SLrst and the reference signal line SLcom are provided in a zig-zag manner along the partial photodiodes 30S and intersect the coupling portion CA2a.

The reference signal line SLcom is electrically coupled to the lower conductive layer 35 through a contact hole H11A. The reference signal line SLcom is electrically coupled to the coupling portion CA2 through a contact hole H11B. This configuration electrically couples the reference signal line SLcom to the p-type semiconductor layer 33 of each of the partial photodiodes 30S.

In the present embodiment, the partial photodiode 30S is provided for each of the openings OP1 of the optical filter 7. This configuration can reduce the semiconductor layers and wiring layers of the photodiode 30A in an area not overlapping the openings OP1 as compared with the photodiode 30 of the embodiment described above. Therefore, the parasitic capacitance of the photodiode 30A can be reduced. Since the multiple partial photodiodes 30S are provided, the degree of freedom of the layout of the transistors and the wiring can be increased, and thus, the transistors and the wiring can be provided so as not to overlap the photodiode 30A. Consequently, in the present embodiment, the parasitic capacitance of the photodiode 30A can be made smaller than that in a case of providing the photodiode 30A so as to overlap the transistors and the wiring.

In the photodiode 30A (detection element 3A) of the fourth modification, the first inorganic insulating film 27A, the first organic insulating film 28A, the second inorganic insulating film 27B, and the second organic insulating film 28B (refer to FIG. 7) are provided so as to cover the partial photodiodes 30S, the coupling portions CA1, CA2, and CA2*a*, and the base portions BA1 and BA2. The relation among the film thicknesses of the insulating films can also be the same as that in the embodiment described above.

The planar structure of the photodiode 30A and the transistors illustrated in FIG. 8 is merely an example, and can be changed as appropriate. For example, the number of the partial photodiodes 30S included in each of the photodiodes 30A may be seven or smaller, or nine or larger. The arrangement of the partial photodiodes 30S is not limited to the triangular lattice pattern. The partial photodiodes 30S may be arranged, for example, in a matrix having a row-column configuration. The arrangement of the signal lines is merely exemplary, and can be changed as appropriate. The arrangement of the transistors can also be changed depending on the number and arrangement of the partial photodiodes 30S.

While the preferred embodiment of the present disclosure has been described above, the present disclosure is not limited to the embodiment described above. The content disclosed in the embodiment is merely an example, and can be variously modified within the scope not departing from the gist of the present disclosure. Any modifications appropriately made within the scope not departing from the gist of the present disclosure also naturally belong to the technical scope of the present disclosure. At least one of various omissions, substitutions, and changes of the components can be made without departing from the gist of the embodiment and the modifications described above.

What is claimed is:

1. A detection apparatus comprising:
a substrate;
a plurality of photodiodes that are arranged on the substrate and each comprises a p-type semiconductor layer, an i-type semiconductor layer, and an n-type semiconductor layer stacked on the substrate;
a plurality of transistors provided for the respective photodiodes;
an insulating film provided on the upper side of the substrate so as to cover the transistors;
a first inorganic insulating film provided on the upper side of the insulating film so as to cover the photodiodes;
a first organic insulating film provided on the upper side of the first inorganic insulating film; and
an upper conductive layer that is provided on the upper side of the first organic insulating film and is electrically coupled to the photodiode through a contact hole passing through the first inorganic insulating film and the first organic insulating film in a thickness direction of the first inorganic insulating film and the first organic insulating film, wherein each of the photodiodes comprises:
a plurality of first regions in each of which the p-type semiconductor layer, the i-type semiconductor layer, and the n-type semiconductor layer are stacked so as to be directly in contact with one another; and
a second region in which at least the p-type semiconductor layer and the i-type semiconductor layer are stacked so as to be separate from each other, and
wherein the adjacent first regions are coupled together at least by the p-type semiconductor layer.

2. The detection apparatus according to claim 1, further comprising:
a second inorganic insulating film provided on the upper side of the first organic insulating film so as to cover the upper conductive layer; and
a second organic insulating film provided on the upper side of the second inorganic insulating film.

3. The detection apparatus according to claim 2,
wherein the first inorganic insulating film has a larger thickness than that of the second inorganic insulating film.

4. The detection apparatus according to claim 1, further comprising an intermediate conductive layer provided on the upper side of each photodiode,
wherein the upper conductive layer is in contact with the intermediate conductive layer at a bottom of the contact hole.

5. The detection apparatus according to claim 4,
wherein the first inorganic insulating film has a larger thickness than a total thickness of the upper conductive layer and the intermediate conductive layer.

6. The detection apparatus according to claim 1,
wherein the p-type semiconductor layer is provided in the same layer as a semiconductor layer of the transistors.

7. The detection apparatus according to claim 1,
wherein the first regions are arranged in a triangular lattice pattern in plan view in a direction orthogonal to the substrate.

8. A detection apparatus comprising:
a substrate;
a plurality of photodiodes that are arranged on the substrate and each comprises a p-type semiconductor layer, an i-type semiconductor layer, and an n-type semiconductor layer stacked on the substrate;
a first inorganic insulating film provided so as to cover the photodiodes;
a first organic insulating film provided on the upper side of the first inorganic insulating film; and
an upper conductive layer that is provided on the upper side of the first organic insulating film and is electrically coupled to the photodiode through a contact hole passing through the first inorganic insulating film and the first organic insulating film in a thickness direction of the first inorganic insulating film and the first organic insulating film,
wherein each of the photodiodes comprises a plurality of first regions in each of which the p-type semiconductor layer, the i-type semiconductor layer, and the n-type semiconductor layer are stacked so as to be directly in contact with one another, and
wherein among the first regions, adjacent two first regions are coupled together by the p-type semiconductor layer.

9. The detection apparatus according to claim 8, further comprising:
a second inorganic insulating film provided on the upper side of the first organic insulating film so as to cover the upper conductive layer; and
a second organic insulating film provided on the upper side of the second inorganic insulating film.

10. The detection apparatus according to claim 9, wherein the first inorganic insulating film has a larger thickness than that of the second inorganic insulating film.

11. The detection apparatus according to claim 8, further comprising an intermediate conductive layer provided on the upper side of each photodiode, wherein the upper conductive layer is in contact with the intermediate conductive layer at a bottom of the contact hole.

12. The detection apparatus according to claim 11, wherein the first inorganic insulating film has a larger thickness than a total thickness of the upper conductive layer and the intermediate conductive layer.

13. The detection apparatus according to claim 8, wherein each of the photodiodes further comprises a second region in which the p-type semiconductor layer and the i-type semiconductor layer are stacked so as to be separate from each other, and wherein the second region is located between the two first regions.

14. The detection apparatus according to claim 13, wherein the second region comprises at least one insulating film located between the p-type semiconductor layer and the i-type semiconductor layer.

15. The detection apparatus according to claim 14, wherein the second region comprises a plurality of the insulating film located between the p-type semiconductor layer and the i-type semiconductor layer.

16. A detection apparatus comprising:

a substrate; and a plurality of photodiodes that are arranged on the substrate and each comprises a p-type semiconductor layer, an i-type semiconductor layer, and an n-type semiconductor layer stacked on the substrate, wherein each of the photodiodes comprises a plurality of first regions in each of which the p-type semiconductor layer, the i-type semiconductor layer, and the n-type semiconductor layer are stacked so as to be directly in contact with one another, and wherein among the first regions, adjacent two first regions are coupled together by the p-type semiconductor layer.

17. The detection apparatus according to claim 16, wherein each of the photodiodes further comprises a second region in which the p-type semiconductor layer and the i-type semiconductor layer are stacked so as to be separate from each other, and wherein the second region is located between the two first regions.

18. The detection apparatus according to claim 17, wherein the second region comprises at least one insulating film located between the p-type semiconductor layer and the i-type semiconductor layer.

19. The detection apparatus according to claim 16, wherein among the first regions, two or more first regions are coupled together by the p-type semiconductor layer.

20. The detection apparatus according to claim 17, wherein each of the photodiodes further comprises a third region comprising the p-type semiconductor layer, wherein the p-type semiconductor layer of the third region overlaps neither the i-type semiconductor layer nor the n-type semiconductor layer, and wherein the third region couples the one second region and one of the first regions that is not adjacent to the one second region.

* * * * *